United States Patent
Zheng

(10) Patent No.: US 7,312,495 B2
(45) Date of Patent: Dec. 25, 2007

(54) SPLIT GATE MULTI-BIT MEMORY CELL

(75) Inventor: Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/101,783

(22) Filed: Apr. 7, 2005

(65) Prior Publication Data

US 2006/0226468 A1    Oct. 12, 2006

(51) Int. Cl.
  *H01L 29/76* (2006.01)
(52) U.S. Cl. .................. 257/314; 257/315; 257/316; 257/317; 257/318; 257/319; 257/320; 257/321
(58) Field of Classification Search ................ 257/314, 257/316, 315, 319, 320, 321, 322, 324
  See application file for complete search history.

(56) References Cited

U.S. PATENT DOCUMENTS

| | | | |
|---|---|---|---|
| 6,215,702 | B1 | 4/2001 | Derhacobian et al. |
| 6,721,205 | B2 * | 4/2004 | Kobayashi et al. .... 365/185.26 |
| 2002/0097621 | A1 | 7/2002 | Fujiwara |
| 2003/0142550 | A1 | 7/2003 | Kawahara et al. |
| 2004/0021171 | A1 | 2/2004 | Nishizaka |

FOREIGN PATENT DOCUMENTS

| | | |
|---|---|---|
| DE | 10144700 A1 | 4/2002 |
| EP | 1300888 A1 | 4/2003 |
| WO | WO 01/17031 A1 | 3/2001 |
| WO | US06/12492 | 7/2006 |

* cited by examiner

*Primary Examiner*—Evan Pert
*Assistant Examiner*—Tan Tran
(74) *Attorney, Agent, or Firm*—Ingrassia Fisher & Lorenz, P.C.

(57) ABSTRACT

A multi-bit memory cell (200) with a control gate (220) for controlling a middle portion of a channel region (208) provides improved operation including faster programming at smaller voltages and currents. The memory cell (200) includes a source (204) and a drain (206) diffused into a substrate (202) forming a channel region (208) therebetween. A first charge storing layer (214), a second charge storing layer (216) and the control gate (220) are formed on the substrate (202) over the channel region (208) and a gate (218) is formed over the source (204), the drain (206), the first and second charge storing layers (214, 216) and the control gate (220). Dielectric material (210, 212, 224, 226, 228) separates the source (204) and the drain (206) from the gate (218), and the control gate (220) from the first charge storing layer (214), the second charge storing layer (216) and the gate (218).

19 Claims, 3 Drawing Sheets

SPLIT GATE MULTI-BIT MEMORY CELL

FIELD OF THE INVENTION

The present invention generally relates to nonvolatile memory devices with multi-bit memory cells, and more particularly relates to flash memory devices with multi-bit memory cells capable of being programmed by source side injection.

BACKGROUND OF THE INVENTION

Nonvolatile memory devices are a commonly used electronic component that can store information as data in a plurality of memory cells, the information remaining stored in the memory cells when electrical power to the memory devices is terminated. Flash memory devices are nonvolatile memory devices which can store information in the memory cells through conventional programming and erase techniques.

Some flash memory devices have multi-bit memory cells which can store more than one bit per memory cell. For example, a conventional semiconductor/oxide-nitride-oxide on semiconductor (SONOS) type memory device is capable of storing two bits of data in one memory cell. One typical programming technique of such SONOS memory devices is hot electron injection which involves applying appropriate voltage potentials to the gate source and drain of the device for a specified duration until a charge storing layer accumulates charge. While hot electron injection is a reliable programming technique, it requires high voltage potentials and a relatively high programming current. The high voltage potentials are produced by charge pumps which consume space within the memory devices. The relatively high programming current also restricts the number of memory cells that can be programmed simultaneously.

Accordingly, there is a need for multi-bit flash memory devices which require lower voltage potentials and lower current for programming. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A memory cell is provided for improved operation including faster programming at smaller voltages and currents. The memory cell includes a source and a drain diffused into a substrate and a channel region formed in the substrate between the source and the drain. A first charge storing layer and a second charge storing layer are formed on the substrate over the channel region and a gate is formed over the source, the drain, the first charge storing layer and the second charge storing layer. A midpoint of the channel region is located equidistant between the source and the drain and a control gate for controlling a middle portion of the channel region is formed over the midpoint of the channel region, the control gate located equidistant between the first charge storing layer and the second charge storing layer and underneath the gate. Dielectric material separates the source from the gate, the drain from the gate, and the control gate from the first charge storing layer, the second charge storing layer and the gate.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
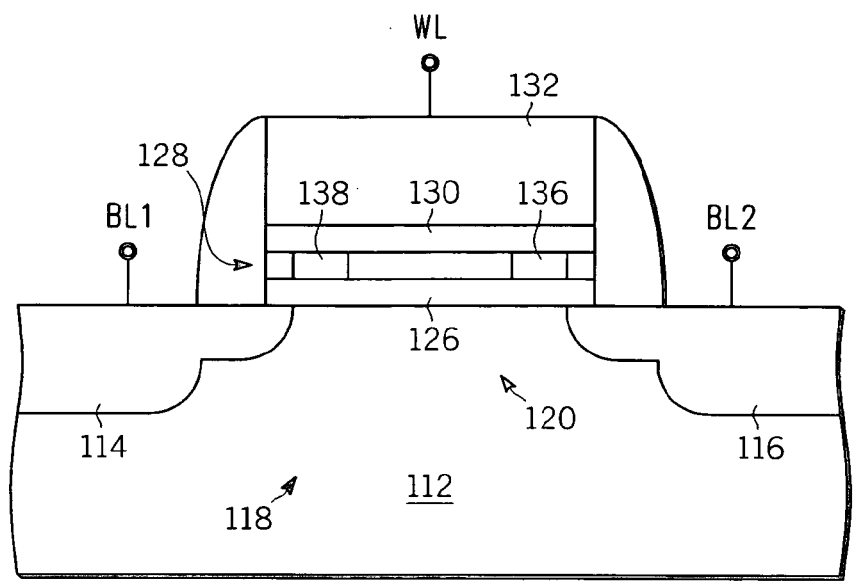
FIG. 1 is a depiction of one type of a conventional SONOS flash memory cell

Referring to FIG. 1 one type of a conventional nonvolatile SONOS memory device 100 includes a semiconductor substrate 112 having a source 114 and a drain 116 formed therein. A body 118 having a channel region 120 is formed between the source 114 and the drain 116. An oxide-nitride-oxide (ONO) dielectric stack is formed above the body 118. A polysilicon gate electrode 132 is formed over the ONO stack. The ONO stack includes a bottom dielectric layer 126, a charge storing layer 128 and a top dielectric layer 130. Within the charge storing layer 128, the multi-bit flash memory device 100 includes a first charge storing cell 136 and a second charge storing cell 138, sometimes called the normal bit and the complementary bit, respectively. In addition to the conventional nonvolatile SONOS memory device 100, a SONOS flash memory cell can also be of planar structure, where the ONO layer is continuous in the core array area. Such a SONOS flash memory cell differs from the conventional nonvolatile SONOS memory device 100 shown in FIG. 1 in that no spacer 128 is present in the planar structures.

The memory device 100 can be programmed, read and erased by the application of appropriate voltage potentials through wordline (WL) and bitlines (BL1, BL2) through conventional techniques. Programming such SONOS memory devices by hot electron injection involves applying appropriate voltage potentials to the gate electrode 132, the source 114 and the drain 116 for a specified duration until the charge storing layer 128 accumulates charge. By exchanging the source and drain voltages, the second bit of the same memory cell can be programmed. Erase in the conventional nonvolatile SONOS memory device 100 is accomplished by band to band hot hole injection. Such a process is disclosed in U.S. Pat. No. 6,215,702.

Figure 2:
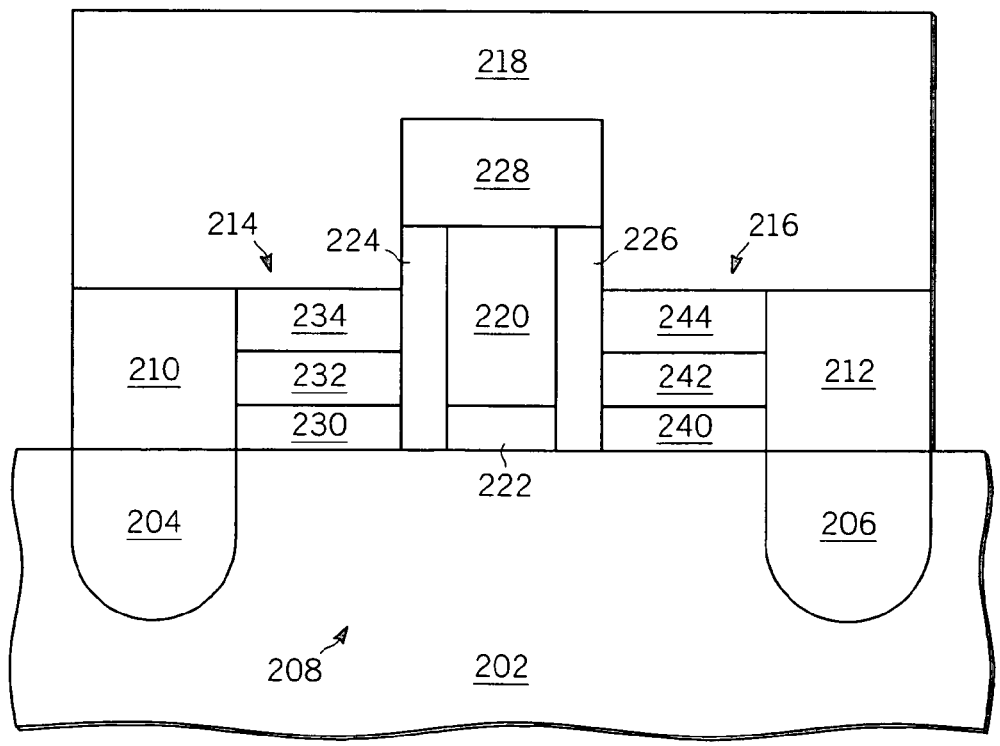
FIG. 2 is a diagram of the memory cell structure of a multi-bit flash memory device in accordance with the preferred embodiment of the present invention.

Referring to FIG. 2, the structure of a multi-bit flash memory cell 200 in accordance with the preferred embodiment of the present invention is depicted. The memory cell 200 includes a source 204 and a drain 206 diffused into a substrate 202. The source 204 and the drain 206 have a channel region 208 formed therebetween. A first dielectric layer 210 is formed over the source 204 and a second dielectric layer 212 is formed over the drain 206.

A first charge storing layer 214 of the memory cell 200 is formed over a portion of the channel region 208 abutting the first dielectric layer 210 and a second charge storing layer 216 is formed over another portion of the channel region 208 abutting the second dielectric layer 212. A gate 218 is formed over the source 210, the drain 212, the first charge storing layer 214 and the second charge storing layer 216.

In accordance with the preferred embodiment of the present invention, a control gate 220 is formed over a middle portion of the channel region 208, i.e., over a midpoint of the channel region 208 located equidistant from the source 204 and the drain 206. The control gate 220 is located equidistant between the first charge storing layer 214 and the second charge storing layer 216 and underneath the gate 218. The control gate 220 is formed over a control gate bottom dielectric layer 222 formed on the substrate 202 and is separated from the first charge storing layer 214, the second charge storing layer 216 and the gate 218 by dielectric material composed of a third dielectric layer 224, a fourth dielectric layer 226 and a fifth dielectric layer 228. The third dielectric layer 224 is formed over a portion of the channel region 208 and abuts the first charge storing layer 214 and the control gate bottom dielectric layer 222. The fourth dielectric layer 226 is formed over another portion of the channel region 208 and abuts the control gate bottom dielectric layer 222 and the second charge storing layer 216. The fifth dielectric layer 228 is formed over the third dielectric layer 224, the fourth dielectric layer 226 and the control gate 220 and under the gate 218.

The first charge storing layer 214 and the second charge storing layer 216 are each composed of an ONO layer having a bottom oxide dielectric layer 230, 240, a middle nitride charge trapping layer 232, 242 and a top oxide dielectric layer 234. The nitride charge trapping layers 232, 242 have a nitride charge trapping layer length (i.e., the length of the nitride charge trapping layer 232 measured from the first dielectric layer 210 to the third dielectric layer 224 or the length of the nitride charge trapping layer 242 measured from the fourth dielectric layer 226 to the second dielectric layer 212) sufficient to accommodate a charge distribution width associated with the properties of the nitride and is preferably between 150 angstroms and 300 angstroms.

The dielectric material of first dielectric layer 210, second dielectric layer 212, third dielectric layer 224, fourth dielectric layer 226 and fifth dielectric layer 228 may be either an oxide, a nitride or an ONO dielectric material depending upon the process used to form the memory cell 200. The third dielectric layer 224 and the fourth dielectric layer 226 separate the control gate 220 from the first charge storing layer 214 and the second charge storing layer 216, respectively, by an isolation dielectric thickness preferably between 70 and 150 angstroms depending upon the process limitations. The gate 218 is preferably composed of polysilicon. So long as the isolation dielectric thickness is greater than 70 angstroms, leakage between the gate 218 and the control gate 220 is not a concern.

In accordance with the preferred embodiment of the present invention, the control gate 220 is composed of polysilicon and has a control gate width measured from the third dielectric 224 to the fourth dielectric 226 and a control gate thickness measured from the bottom dielectric 222 to the fifth dielectric 228. The control gate width and the control gate thickness depend on the process limitations and the resistance of the control gate 220. The control gate width is preferably greater than 250 angstroms and can affect programming efficiency. The control gate thickness is preferably between 300 angstroms and 500 angstroms. The control gate bottom dielectric layer 222 is composed of oxide and preferably has a control gate oxide thickness (measured from the substrate 202 to the control gate 220) between 50 angstroms and 70 angstroms depending on the process limitations.

The memory cell 200 can store two bits in one memory cell 200 in the first charge storing layer 214 and the second charge storing layer 216. The present invention advantageously permits programming information in nitride charge trapping layers 232, 242 by source side injection rather than hot electron injection because of the control gate 220. While hot electron injection is a reliable programming technique, it requires high voltage potentials and a relatively high programming current thereby providing low programming efficiency. The high voltage potentials required for hot electron injection are produced by charge pumps which consume space within the memory devices. The relatively high programming current also restricts the number of memory cells that can be programmed simultaneously. The control gate 220 controls the middle portion of the channel region 208 during programming thereby enabling information to be stored in the memory cell 200 by programming either the first charge storing layer 214 or the second charge storing layer 216 by source side injection.

Source side injection requires programming current much lower than hot electron injection, thereby enabling page programming (i.e., large number of memory cells being programmed simultaneously providing greatly improved programming efficiency of the memory cell 200 through fast page programming up to one hundred megabits per second). Source side injection also requires lower programming voltages than hot electron injection, thus charge pumps for source side injection are smaller than charge pumps for hot electron injection.

The conventional multi-bit flash SONOS memory device is also subject to charge spread between the normal bit 36 and the complementary bit 38 (FIG. 1) over program/erase cycling. The physically isolated first and second charge storage layers 214, 216 and the source side injection programming improve the overlap of electron and hole distribution during programming and erasing of information and, therefore, improves the reliability and data retention of the memory cell 200. Localized charge storage in first and second charge storage layers 214, 216 enabled by control gate 220 eliminates charge spread into the middle portion of the channel 208 resulting in no erase slowdown over cycling and possibly better data retention. By eliminating charge spread in the middle of the channel 208, the complementary bit disturb (the effect on the threshold voltage level change of the first bit when the second bit is programmed) can also be reduced thereby advantageously allowing a larger voltage threshold window.

Figure 3:
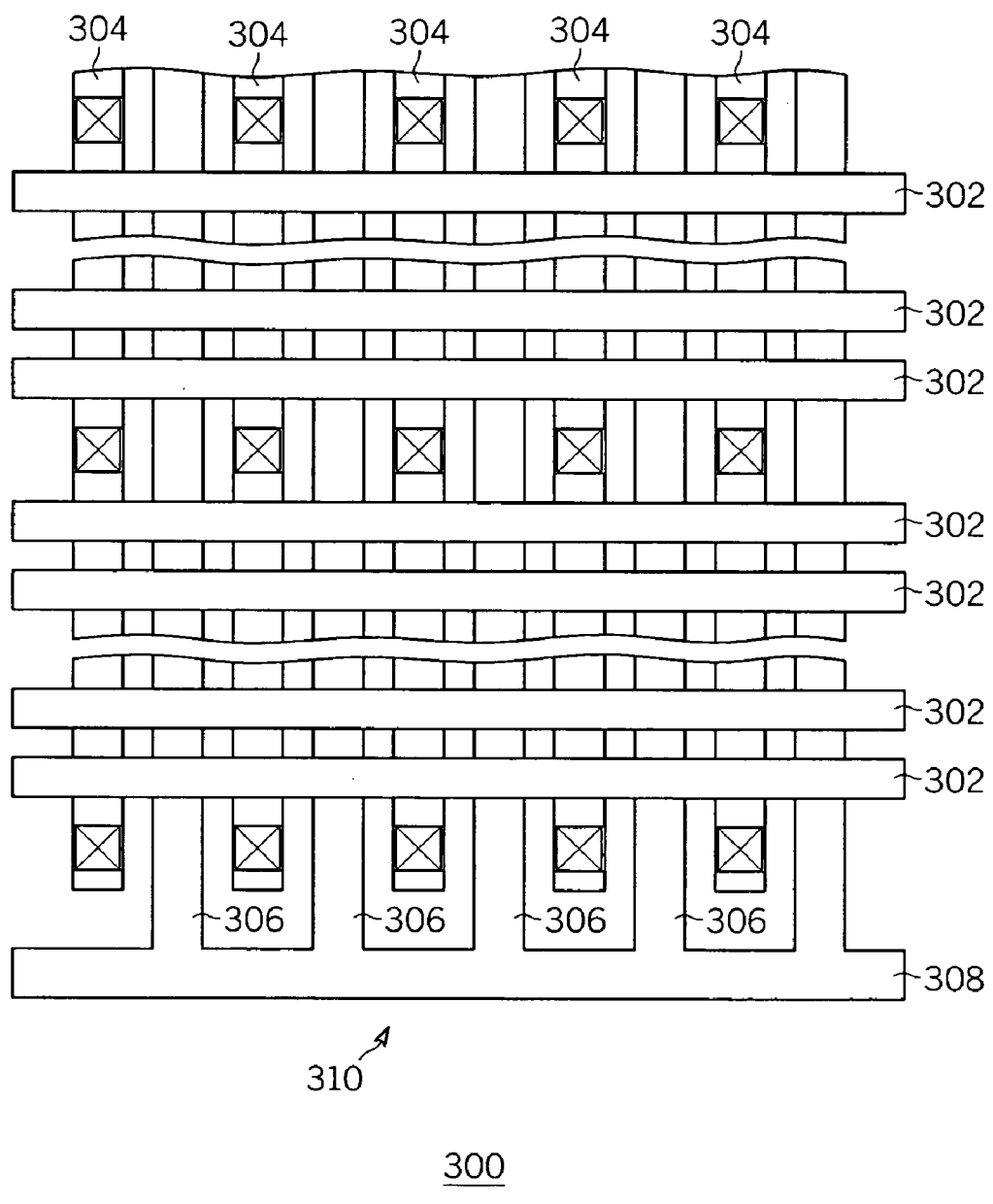
FIG. 3 is a top view of an array of memory cells of a multi-bit flash memory device in accordance with the preferred embodiment of the present invention.

A top view of a portion of an array 300 of memory cells 200 of a multi-bit flash memory device in accordance with the preferred embodiment of the present invention is depicted in FIG. 3. The array 300 includes a plurality of parallel word lines 302 and a plurality of parallel bit lines 304. The plurality of bit lines are formed perpendicular to the word lines 302. The gates 218 (FIG. 2) of each memory cell 200 are formed from, connected to or otherwise coupled to one of the plurality of word lines 302 of the array 300. In a like manner, the sources 204 and the drains 206 (FIG. 2) of each memory cell 200 are formed from, connected to or otherwise coupled to one of the plurality of bit lines 304 of the array 300.

In accordance with the present invention, a plurality of control gate lines 306 are formed parallel to one another and parallel to the plurality of bit lines 304. The control gates 220 (FIG. 2) of each memory cell 200 are formed from, connected to or otherwise coupled to one of the plurality of control gate lines 306 of the array 300 and each of the plurality of control gate lines 306 are coupled to a common line 308. The common line is formed parallel to the plurality of word lines 302 and located on a side 310 outside the array 300. The array 300, therefore, is only one word line width larger than an array of a conventional multi-bit flash memory device, the one word line width accommodating the common line 308.

In operation, information is stored in the array 300 of memory cells 200 by programming one of the charge storing layers 214, 216 (FIG. 2) by source side injection at lesser programming voltages than programming of a conventional multi-bit flash memory device. Programming is accomplished by applying about seven to nine volts to the one of the plurality of word lines 302 and about four volts to the one of the plurality of bit lines 304 intersecting at the charge storing layers 214, 216 to be programmed while maintaining the voltage level of the plurality of control gate lines 306 between one volt and two volts above a programming threshold voltage associated with the channel 208 and floating the other ones of the plurality of word lines 302 and bit lines 304. With the lowered voltage of programming in accordance with the present invention, page programming can be accomplished allowing data storage programming times in multi-bit flash memory devices having the reliability necessary for code storage.

Erasing of the memory cells 200 in the array 300 is the same as erasing operations of conventional multi-bit flash memory device in that approximately five to six volts is applied to selected word lines 302 and bit lines 304. The control gate lines 306 are floated during erase operations. For read operations, the control gate lines are biased at approximately two volts above the threshold voltage of the channel 208 (FIG. 2); approximately four volts is applied to the selected word lines 302 and approximately one volt is applied to the selected bit lines 304 similar to read operations of conventional multi-bit flash memory devices. Current leakage between neighboring bit lines 304 during reading of a memory cell 200 is conventionally accomplished by pre-charging the memory cell 200 before reading. The present invention advantageously eliminates the need for pre-charging during read operations in that the control gates 220 can be used to turn off the leakage path between neighboring bit lines 304. Also, it can be seen that decoding of the array 300 can be simplified by biasing the plurality of control gate lines at approximately two volts above the channel 208 threshold voltage for both programming operations and read operations.

Figure 4:
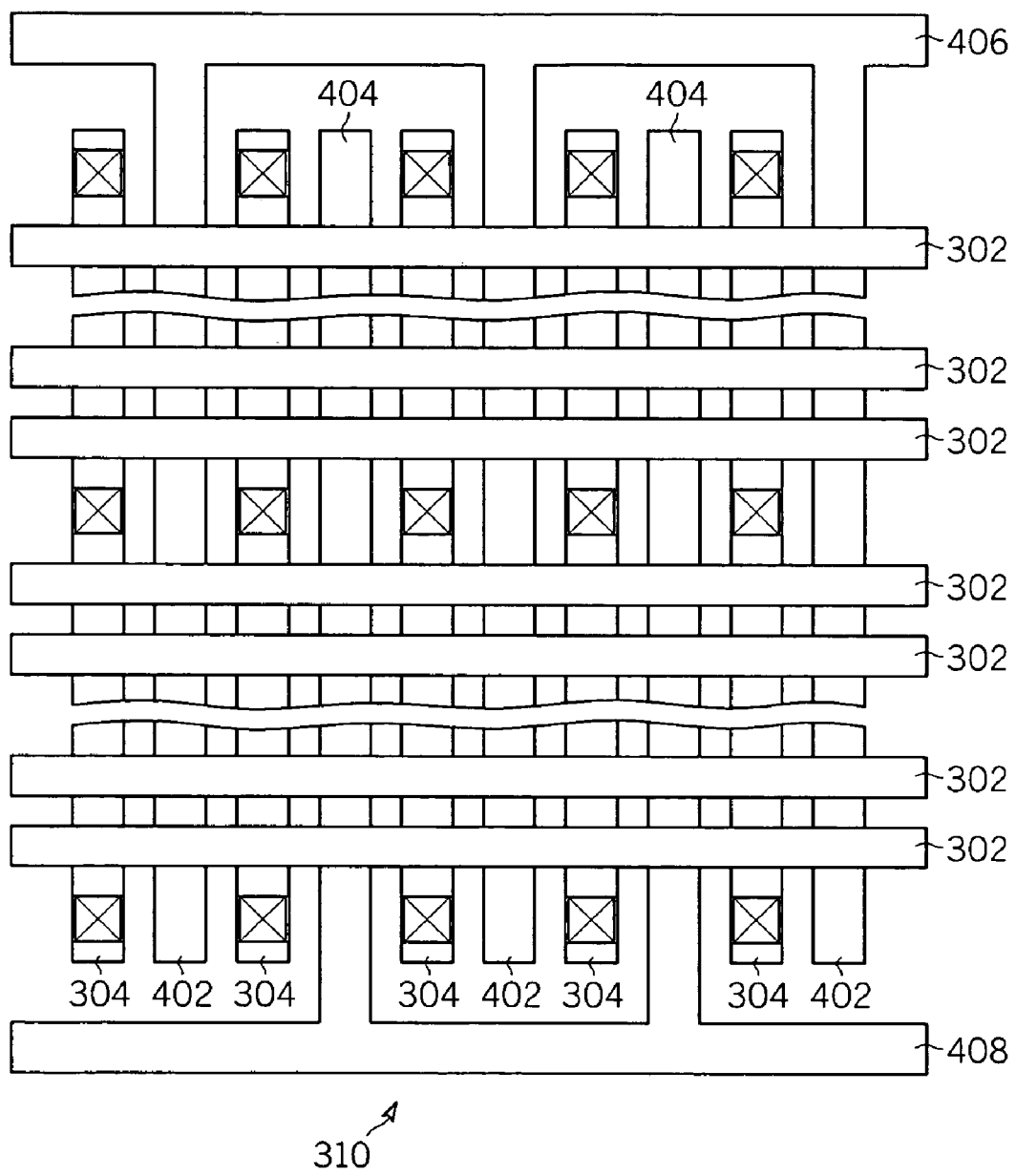
FIG. 4 is a top view of an array of memory cells of a multi-bit flash memory device in accordance with an alternate embodiment of the present invention.

Referring to FIG. 4, an alternate embodiment of the present invention depicts an array 400 of memory cells 200. The array 400 advantageously reduces leakage current from adjacent ones of the plurality of bit lines 304 by coupling the plurality of control gate lines 402, 404 alternately to two common lines 406, 408 formed parallel to the plurality of word lines 302 and located on both sides (the side parallel to and opposite to side 310 and side 310) outside the array 400. Alternate ones of the plurality of control gate lines 402, 404 are coupled to alternate ones of the two common lines 406, 408, respectively, thereby helping to reduce leakage current between neighboring control gate lines 406 and 408 and increasing the size of the array 400 by only two word line widths larger than an array of a conventional multi-bit flash memory device.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory cell comprising:
   a source and a drain diffused into a substrate, the source and the drain having a channel region therebetween with a midpoint of the channel region being located equidistant from the source and the drain;
   a first charge storing layer and a second charge storing layer formed on the substrate over the channel region, the first charge storing layer composed of a first material and the second charge storing layer composed of a second material;
   a gate formed over the source, the drain, the first charge storing layer and the second charge storing layer;
   a control gate formed over the midpoint of the channel region for controlling a middle portion of the channel region, said control gate located equidistant between the first charge storing layer and the second charge storing layer and underneath the gate; and
   a plurality of dielectric layers, wherein a first of the plurality of dielectric layers separating the source from the gate, a second of the plurality of dielectric layers separating the drain from the gate, and a third, a fourth and a fifth of the plurality of dielectric layers separating the control gate from the first charge storing layer, the second charge storing layer and the gate, respectively, and wherein at least the third and the fourth of the plurality of dielectric layers is composed of a third material, the third material providing an isolation dielectric thickness of greater than seventy Angstroms in order to separate the first material of the first charge storing layer and the second material of the second charge storing layer from the control gate, and wherein at least one of the first and second materials is an ONO material composed of a bottom dielectric layer of oxide, a middle nitride charge trapping layer and a top dielectric layer of oxide, wherein the middle nitride charge trapping layer has a nitride charge trapping layer length between 150 angstroms and 300 angstroms.

2. The memory cell of claim 1 further comprising a control gate bottom dielectric layer formed on the substrate and between the control gate and the substrate.

3. The memory cell of claim 2 wherein the control gate bottom dielectric layer is composed of oxide and has a control gate oxide thickness between 50 angstroms and 70 angstroms.

4. The memory cell of claim 1 wherein the control gate is composed of polysilicon.

5. The memory cell of claim 1 wherein the control gate has a control gate width greater than 250 angstroms and has a control gate thickness between 300 angstroms and 500 angstroms.

6. The memory cell of claim 1 wherein each of the plurality of dielectric layers is composed of one of the set of dielectric materials consisting of oxide or nitride material.

7. The memory cell of claim 1 wherein the third one of the plurality of dielectric layers separating the control gate from the first charge storing layer has an isolation dielectric thickness between 70 and 150 angstroms.

8. The memory cell of claim 1 wherein the fourth one of the plurality of dielectric layers separating the control gate from the second charge storing layer has an isolation dielectric thickness between 70 and 150 angstroms.

9. The memory cell of claim 1 wherein the gate is composed of polysilicon.

10. The memory cell of claim 1 wherein information is stored in the memory cell by programming by source side injection one of the first charge storing layer or the second charge storing layer.

11. A memory cell comprising:
a source and a drain diffused into a substrate, the source and the drain having a channel region therebetween with a midpoint of the channel region being located equidistant from the source and the drain;
a first charge storing layer and a second charge storing layer formed on the substrate over the channel region;
a gate formed over the source, the drain, the first charge storing layer and the second charge storing layer;
a control gate formed over the midpoint of the channel region for controlling a middle portion of the channel region, said control gate located equidistant between the first charge storing layer and the second charge storing layer and underneath the gate; and
a plurality of dielectric layers, wherein a first of the plurality of dielectric layers separating the source from the gate, a second of the plurality of dielectric layers separating the drain from the gate, and a third, a fourth and a fifth of the plurality of dielectric layers separating the control gate from the first charge storing layer, the second charge storing layer and the gate, respectively, and
wherein the first charge storing layer is an ONO layer composed of a bottom dielectric layer of oxide, a middle nitride charge trapping layer and a top dielectric layer of oxide and having a nitride charge trapping layer length between 150 angstroms and 300 angstroms.

12. A memory cell comprising:
a source and a drain diffused into a substrate, the source and the drain having a channel region therebetween with a midpoint of the channel region being located equidistant from the source and the drain;
a first charge storing layer and a second charge storing layer formed on the substrate over the channel region;
a gate formed over the source, the drain, the first charge storing layer and the second charge storing layer;
a control gate formed over the midpoint of the channel region for controlling a middle portion of the channel region, said control gate located equidistant between the first charge storing layer and the second charge storing layer and underneath the gate; and
a plurality of dielectric layers, wherein a first of the plurality of dielectric layers separating the source from the gate, a second of the plurality of dielectric layers separating the drain from the gate, and a third, a fourth and a fifth of the plurality of dielectric layers separating the control gate from the first charge storing layer, the second charge storing layer and the gate, respectively, and
wherein the second charge storing layer is an ONO layer composed of a bottom dielectric layer of oxide, a middle nitride charge trapping layer and a top dielectric layer of oxide and having a nitride charge trapping layer length between 150 angstroms and 300 angstroms.

13. A memory device comprising an array of memory cells, each memory cell comprising:
a source and a drain diffused into a substrate level, the source and the drain having a channel region therebetween with a midpoint of the channel region being located equidistant from the source and the drain;
a first charge storing layer and a second charge storing layer formed on the substrate level over the channel region, wherein the first are second charge storing layers each comprise an ONO layer composed of a bottom dielectric layer of oxide, a middle nitride charge trapping layer and a top dielectric layer of oxide, and wherein at least one of the first charge storing layer and the second charge storing layer have a nitride charge trapping layer length between 150 angstroms and 300 angstroms;
a gate formed over the source, the drain, the first charge storing layer and the second charge storing layer;
a control gate formed over the midpoint of the channel region for controlling said middle portion, said control gate located equidistant between the first charge storing layer and the second charge storing layer and underneath the gate; and
a plurality of dielectric layers, wherein a first one of the plurality of dielectric layers separating the source from the gate, a second one of the plurality of dielectric layers separating the drain from the gate, and a third one, fourth one and fifth one of the plurality of dielectric layers separating the control gate from the first charge storing layer, the second charge storing layer and the gate, respectively, and
wherein the control gate of each memory cell is coupled to one of a plurality of control gate lines, each of the plurality of control gate lines formed parallel to other ones of the plurality of control gate lines and each of the plurality of control gate lines connected to all other ones of the plurality of control gate lines through a common line located on a first side outside the array of memory cells.

14. The memory device of claim 13 wherein the array of memory cells further comprises a plurality of word lines, each of said plurality of word lines being parallel to the other ones of said plurality of word lines, and wherein the gate of each memory cell is coupled to one of the plurality of word lines.

15. The memory device of claim 14 wherein the array of memory cells further comprises a plurality of bit lines, each of said plurality of bit lines being parallel to other ones of said plurality of bit lines and to each of the plurality of control gate lines and each of said plurality of bit lines being perpendicular to the plurality of word lines, and wherein the source of each memory cell is coupled to one of the plurality of bit lines.

16. The memory device of claim 15 wherein the drain of each memory cell is also coupled to one of the plurality of bit lines.

17. The memory device of claim 13 wherein information is stored in the array of memory cells by programming the first charge storing layer or the second charge storing layer of at least one of the array of memory cells by source side injection while maintaining the voltage level of the control gate of the at least one of array of memory cells at between approximately one volt and two volts above a threshold voltage associated with the channel region of the at least one of the array of memory cells.

18. The memory device of claim 13 wherein information is erased from the array of memory cells by erasing the first charge storing layer or the second charge storing layer of at least one of the array of memory cells while floating the control gate of the at least one of array of memory cells.

19. The memory device of claim 13 wherein information is read from the array of memory cells by reading the first charge storing layer or the second charge storing layer of at least one of the array of memory cells while maintaining the voltage level of the control gate of the at least one of array of memory cells at approximately two volts above a threshold voltage associated with the at least one of the array of memory cells.

* * * * *